United States Patent
Sagawai

(10) Patent No.: US 11,366,553 B2
(45) Date of Patent: Jun. 21, 2022

(54) INPUT DEVICE

(71) Applicant: Alps Alpine Co., Ltd., Tokyo (JP)

(72) Inventor: Shinichi Sagawai, Miyagi-ken (JP)

(73) Assignee: ALPS ALPINE CO., LTD., Tokyo (JP)

( * ) Notice: Subject to any disclaimer, the term of this patent is extended or adjusted under 35 U.S.C. 154(b) by 0 days.

(21) Appl. No.: 16/863,209

(22) Filed: Apr. 30, 2020

(65) Prior Publication Data
US 2020/0264716 A1 Aug. 20, 2020

Related U.S. Application Data

(63) Continuation of application No. PCT/JP2018/031641, filed on Aug. 28, 2018.

(30) Foreign Application Priority Data

Nov. 10, 2017 (JP) .............................. JP2017-217673

(51) Int. Cl.
G06F 3/044 (2006.01)

(52) U.S. Cl.
CPC .................................... *G06F 3/044* (2013.01)

(58) Field of Classification Search
CPC ......... G06F 3/044; H01H 36/00; H03K 17/96
See application file for complete search history.

(56) References Cited

U.S. PATENT DOCUMENTS

| | | | | |
|---|---|---|---|---|
| 10,459,560 B2* | 10/2019 | Kim | ..................... | G02F 1/13338 |
| 2006/0097991 A1* | 5/2006 | Hotelling | ............ | G06F 3/04166 |
| | | | | 345/173 |
| 2009/0085885 A1* | 4/2009 | Wu | ........................ | G06F 3/0446 |
| | | | | 345/173 |
| 2010/0007621 A1* | 1/2010 | Kang | .................... | G06F 3/0445 |
| | | | | 345/173 |
| 2010/0230180 A1* | 9/2010 | Yamauchi | ............ | H03K 17/955 |
| | | | | 178/18.06 |
| 2013/0093725 A1* | 4/2013 | Reynolds | ................ | G06F 3/044 |
| | | | | 345/174 |
| 2014/0152327 A1* | 6/2014 | Erkens | ............... | G01R 27/2605 |
| | | | | 324/658 |
| 2014/0333579 A1* | 11/2014 | Sleeman | ............... | G06F 3/0202 |
| | | | | 345/174 |

(Continued)

FOREIGN PATENT DOCUMENTS

| | | |
|---|---|---|
| JP | S54-174873 | 12/1979 |
| JP | S62-100919 | 5/1987 |

(Continued)

OTHER PUBLICATIONS

International Search Report from International Application No. PCT/JP2018/031641 dated Oct. 9, 2018.

*Primary Examiner* — Towfiq Elahi
(74) *Attorney, Agent, or Firm* — Beyer Law Group LLP

(57) ABSTRACT

An input device according to an embodiment includes a first sensor electrode disposed on a substrate, a second sensor electrode which faces the first sensor electrode and which is capacitively coupled to the first sensor electrode, and a detection circuit which detects approach of an operation body to the second sensor electrode based on an electrostatic capacitance of the first sensor electrode.

15 Claims, 4 Drawing Sheets

(56) References Cited

U.S. PATENT DOCUMENTS

| | | | |
|---|---|---|---|
| 2015/0091587 A1* | 4/2015 | Shepelev | G06F 3/0446 |
| | | | 324/658 |
| 2016/0117005 A1* | 4/2016 | Osawa | H03K 17/9622 |
| | | | 345/173 |
| 2016/0378241 A1* | 12/2016 | Park | G03F 1/68 |
| | | | 345/173 |
| 2017/0215254 A1 | 7/2017 | Koresawa et al. | |
| 2019/0239311 A1* | 8/2019 | Yoneyama | H03K 17/962 |
| 2020/0210066 A1* | 7/2020 | Yamamoto | G06F 3/041662 |

FOREIGN PATENT DOCUMENTS

| | | |
|---|---|---|
| JP | 2009-214559 | 9/2009 |
| JP | 2011-96369 | 5/2011 |
| JP | 2017-135103 | 8/2017 |

\* cited by examiner

INPUT DEVICE

CLAIM OF PRIORITY

This application is a Continuation of International Application No. PCT/JP2018/031641 filed on Aug. 28, 2018, which claims benefit of Japanese Patent Application No. 2017-217673 filed on Nov. 10, 2017. The entire contents of each application noted above are hereby incorporated by reference.

BACKGROUND OF THE INVENTION

1. Field of the Invention

The present invention relates to an input device.

2. Description of the Related Art

In general, input devices including a self-capacitance touch sensor have been used. The self-capacitance touch sensor having a sensor electrode which detects approach of an operation body detects approach of the operation body to the sensor electrode by using a change in an electrostatic capacitance of the sensor electrode. An example of such an input device is disclosed in Japanese Unexamined Patent Application Publication No. 2011-96369.

Such a general input device includes a touch sensor and a case accommodating the touch sensor. The touch sensor is disposed such that a sensor electrode mounted on a substrate of the touch sensor faces a sensing area on the case. Therefore, there arises a problem in that, as the sensing area required for the input device becomes larger, the sensor electrode becomes larger, and therefore, a size of the substrate of the touch sensor is increased and layout on the substrate is limited.

SUMMARY OF THE INVENTION

The present invention provides miniaturization of the sensor electrode of the self-capacitance touch sensor.

An input device according to an embodiment includes a first sensor electrode disposed on a substrate, a second sensor electrode which is disposed so as to face the first sensor electrode and which is capacitively coupled to the first sensor electrode, and a detection circuit which detects approach of an operation body to the second sensor electrode based on an electrostatic capacitance of the first sensor electrode.

DESCRIPTION OF THE PREFERRED EMBODIMENTS

Figure 1:
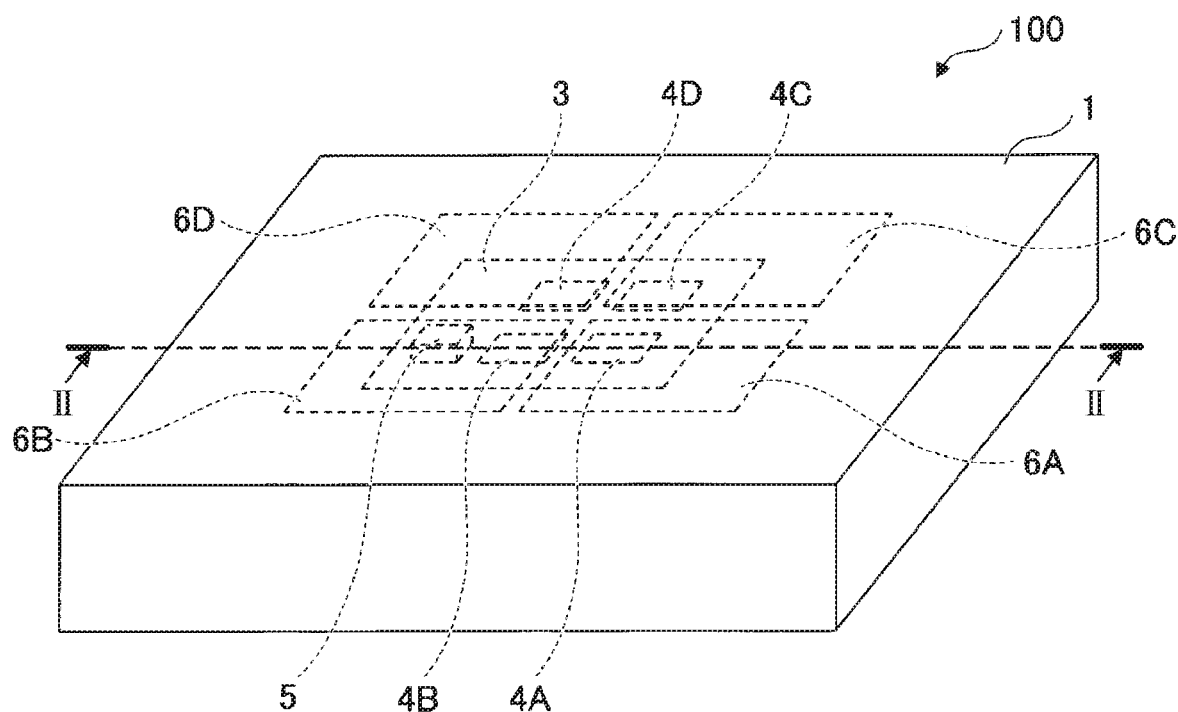
FIG. 1 is a perspective view of an example of an input device according to a first embodiment.

Embodiments of the present invention will be described hereinafter with reference to the accompanying drawings. Note that the components having substantially the same functional configurations are denoted by the same reference numerals so that redundant descriptions are omitted in descriptions in the specification and the drawings according to the embodiments.

First Embodiment

An input device 100 according to the first embodiment will be described with reference to FIGS. 1 to 5. The input device 100 of this embodiment is used to input desired information when the user causes an operation body to approach the input device 100, and includes a self-capacitance touch sensor which detects the approach of the operation body. The operation body is a conductive object used by the user to input information. The operation body is a finger, for example, but is not limited to the finger.

Figure 2:
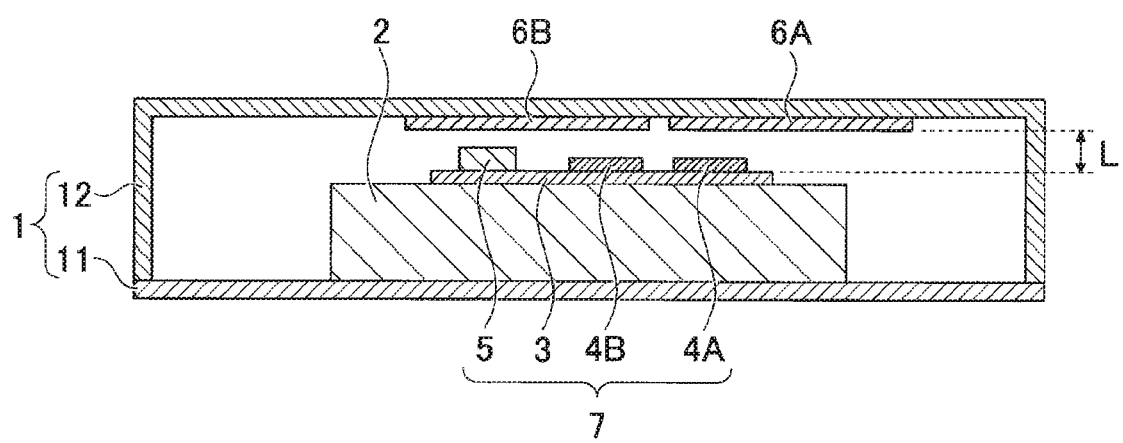
FIG. 2 is a cross-sectional view of the input device illustrated in FIG. 1 taken along a line II to II.

First, a hardware configuration of the input device 100 will be described. FIG. 1 is a perspective view of an example of the input device 100 according to this embodiment. FIG. 2 is a cross-sectional view of the input device 100 illustrated in FIG. 1 taken along a line II to II.

As illustrated in FIGS. 1 and 2, the input device 100 includes a case 1, a support 2, a substrate 3, first sensor electrodes 4A to 4D, a detection circuit 5, and second sensor electrodes 6A to 6D. The substrate 3, the first sensor electrodes 4A to 4D, and the detection circuit 5 constitute a touch sensor 7. Note that, in the example of FIG. 1, the support 2 is omitted so that the other components are clearly viewed.

Although upper and lower directions of the input device 100 are illustrated with reference to FIGS. 1 and 2, the upper and lower directions of the input device 100 are not limited to this. The first sensor electrodes 4A to 4D are referred to as first sensor electrodes 4 when the first sensor electrodes 4A to 4D are not distinguished from one another. Similarly, the second sensor electrodes 6A to 6D are referred to as second sensor electrodes 6 when the second sensor electrodes 6A to 6D are not distinguished from one another.

The case 1 which is an outer package of the input device 100 accommodates the support 2, the substrate 3, the first sensor electrodes 4, and the detection circuit 5. In the example of FIGS. 1 and 2, the case 1 has a rectangular parallelepiped shape and is divided into a lower case 11 serving as a bottom plate of the case 1 and an upper case 12 serving as side plates and a top plate of the case 1. The case 1 is formed by integrating the lower case 11 and the upper case 12 by a certain method, such as fitting, bonding, pressure bonding, or welding. Note that the shape and the division method of the case 1 are not limited to those described above.

The support 2 is an arbitrary part or an arbitrary portion (for example, a portion integrated with the case 1) supporting the substrate 3 such that the substrate 3 faces the top plate of the case 1. Although the support 2 is disposed on an upper surface of the bottom plate of the case 1 in the example of FIG. 2, the support 2 may be disposed on one of the side plates or the top plate of the case 1. Furthermore, although the support 2 has a rectangular parallelepiped shape in the example of FIG. 2, the support 2 may be designed as an arbitrary shape as long as the support 2 is able to support the substrate 3.

The substrate 3 is a printed board, such as a rigid substrate or a flexible substrate and constitutes the touch sensor 7 along with the first sensor electrodes 4 and the detection circuit 5. The substrate 3 is supported by the support 2 so as to face the top plate of the case 1. Although not illustrated, a wiring pattern which connects the first sensor electrode 4 to the detection circuit 5 is formed on an upper surface and a lower surface of the substrate 3. Furthermore, although the substrate 3 has a rectangle shape in the example of FIGS. 1 and 2 in a plan view, the present invention is not limited to this.

The first sensor electrodes 4 are sensor electrodes disposed on the upper surface of the substrate 3 so as to detect approach of the operation body to the second sensor electrodes 6 and are formed of a metallic foil (such as a copper foil), a metallic plate, or plating. The first sensor electrodes 4 are electrically connected to the detection circuit 5 through the wiring pattern disposed on the substrate 3. Furthermore, the first sensor electrodes 4 face the corresponding second sensor electrodes 6. In other words, the substrate 3 is supported by the support 2 such that the first sensor electrodes 4 and the corresponding second sensor electrodes 6 face each other. Note that, in the example of FIGS. 1 and 2, the first sensor electrode 4A corresponds to the second sensor electrode 6A, the first sensor electrode 4B corresponds to the second sensor electrode 6B, the first sensor electrode 4C corresponds to the second sensor electrode 6C, and the first sensor electrode 4D corresponds to the second sensor electrode 6D. Furthermore, although the first sensor electrodes 4 have a rectangle shape in the example of FIGS. 1 and 2 in the plan view, the present invention is not limited to this. Moreover, the input device 100 includes at least one first sensor electrode 4.

The detection circuit 5 detects approach of the operation body to the second sensor electrodes 6 based on electrostatic capacitances C of the first sensor electrodes 4. Although the detection circuit 5 is at least one IC (Integrated Circuit), for example, the present invention is not limited to this. The detection circuit 5 will be described hereinafter in detail.

The second sensor electrodes 6 correspond to a sensing area for detecting approach of the operation body, is disposed in an inner surface of the case 1 (a lower surface of the top plate), and is formed of a metallic foil (such as a copper foil), a metallic plate, or plating. The second sensor electrodes 6 are not connected to neither the first sensor electrodes 4 nor the ground, and are separated from the first sensor electrodes 4 such that the second sensor electrodes 6 face the corresponding first sensor electrodes 4.

Since the second sensor electrodes 6 are disposed in this way, the first sensor electrodes 4 and the corresponding second sensor electrodes 6 are capacitively coupled. As a result, when the operation body approaches one of the second sensor electrodes 6, an electrostatic capacitance C of one of the first sensor electrode 4 corresponding to the second sensor electrode 6 approached by the operation body is changed. Therefore, the detection circuit 5 may detect the approach of the operation body to the second sensor electrode 6 based on the electrostatic capacitance C. When the operation body approaches the second sensor electrode 6A, for example, an electrostatic capacitance Ca of the first sensor electrode 4A corresponding to the second sensor electrode 6A is changed, and therefore, the detection circuit 5 may detect the approach of the operation body to the second sensor electrode 6A based on the electrostatic capacitance Ca.

The second sensor electrodes 6 are preferably formed larger than the first sensor electrodes 4 as illustrated in the example of FIGS. 1 and 2. By this, a size of the sensing area of the input device 100 may be increased without increasing a size of the first sensor electrodes 4.

Note that, although the second sensor electrodes 6 have a rectangle shape in the example of FIGS. 1 and 2 in the plan view, the present invention is not limited to this. Moreover, the input device 100 includes at least one second sensor electrode 6. Furthermore, a distance L between the first sensor electrodes 4 and the corresponding second sensor electrodes 6 which face each other is designed in accordance with sensitivity required for the input device 100 and sensitivity of the touch sensor 7. The distance L is preferably designed smaller as the sensitivity required for the input device 100 is higher. Furthermore, the distance L may be designed larger as the sensitivity of the touch sensor 7 is higher.

Figure 3:
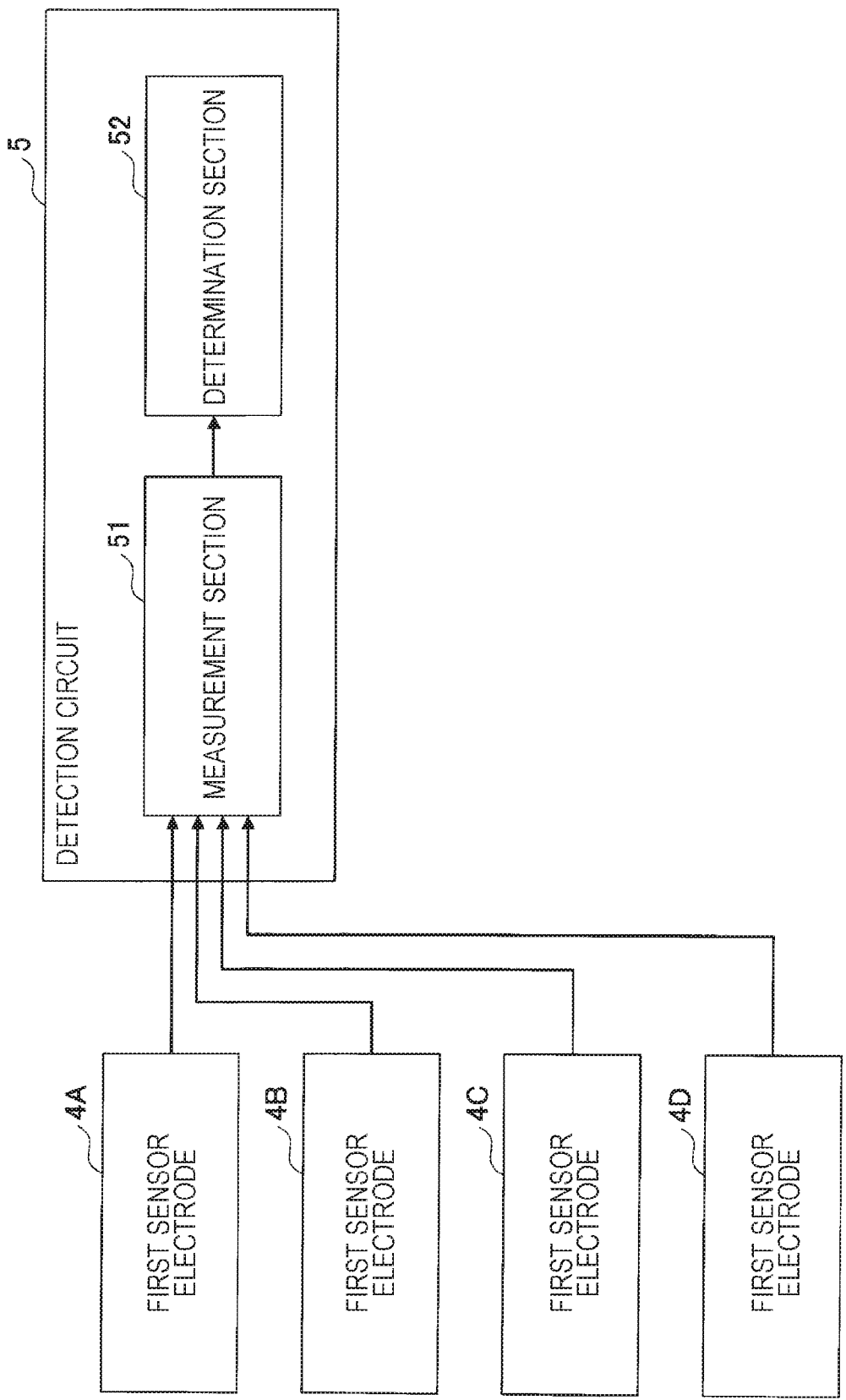
FIG. 3 is a diagram illustrating an example of a functional configuration of a detection circuit.

Next, a functional configuration of the detection circuit 5 will be described. FIG. 3 is a diagram illustrating an example of the functional configuration of the detection circuit 5. As illustrated in FIG. 3, the detection circuit 5 includes a measurement section 51 and a determination section 52.

The measurement section 51 is electrically connected to the individual first sensor electrodes 4 through the wiring pattern disposed on the substrate 3 and measures electrostatic capacitances C of the individual first sensor electrodes 4. A method for measuring the electrostatic capacitances C may be arbitrarily selected. The measurement section 51 is constituted by, for example, a general circuit which measures a CR charging/discharging time, a circuit which transfers charged electric charge to a general capacitor, a circuit which measures an impedance, a circuit which is included in an oscillation circuit and which measures an oscillation frequency, and the like. The electrostatic capacitances C measured by the measurement section 51 are supplied to the determination section 52.

The determination section 52 may determine whether the operation body has approached one of the second sensor electrodes 6 based on the electrostatic capacitances C supplied from the measurement section 51. The determination section 52 may be realized by hardware or software. When the determination section 52 is realized by software, the determination section 52 is constituted by a microcomputer including a CPU (Central Processing Unit), a ROM (Read Only Memory), and a RAM (Random Access Memory) and is realized when the CPU executes a program. A determination method employed in the determination section 52 will be described hereinafter.

Figure 4:
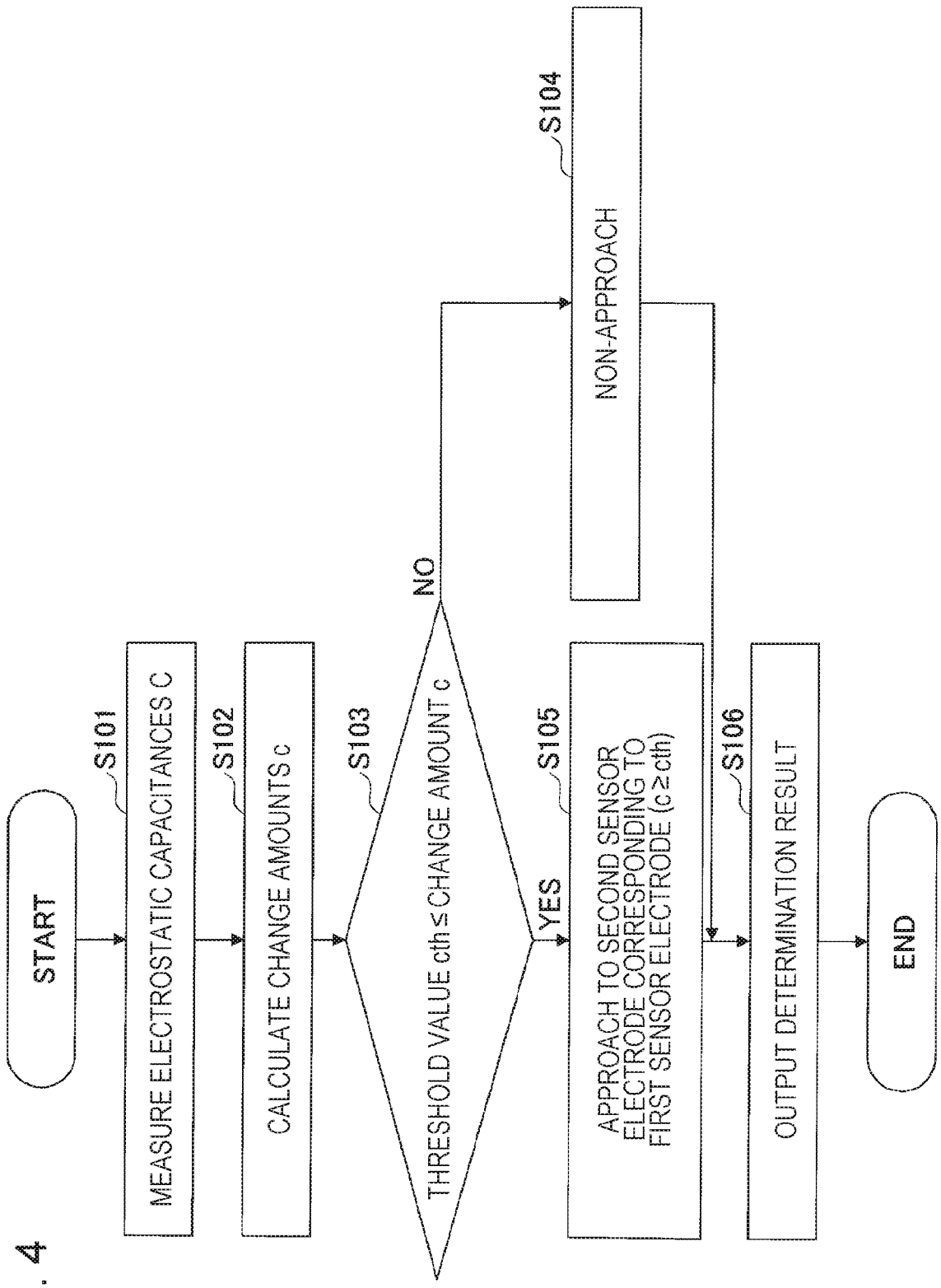
FIG. 4 is a flowchart of an example of an operation of the input device.

Next, an operation of the input device 100 will be described. FIG. 4 is a flowchart of an example of an operation of the input device 100.

First, the measurement section 51 measures electrostatic capacitances C of the individual first sensor electrodes 4 (step S101). By this, electrostatic capacitances Ca to Cd of the first sensor electrodes 4A to 4D are measured. The measurement section 51 inputs the electrostatic capacitances C obtained by the measurement to the determination section 52.

Subsequently, the determination section 52 calculates change amounts c based on the electrostatic capacitances C supplied from the measurement section 51 (step S102). By this, change amounts ca to cd of the electrostatic capacitances Ca to Cd of the first sensor electrodes 4A to 4D are calculated. The change amounts c are differences between reference values of the electrostatic capacitances C and the electrostatic capacitances C measured by the measurement section 51. The reference values of the electrostatic capacitances C of the first sensor electrodes 4 may be different from one another or the same as one another. Furthermore, the reference values of the electrostatic capacitances C may be set in advance or updated based on history data of the electrostatic capacitances C.

Thereafter, the determination section 52 determines whether one of the calculated change amounts c is equal to or larger than a threshold value cth (step S103). The threshold value cth is a threshold value for the change amounts c which is set in advance to detect a touch of the operation body. Different threshold values cth may be set for the different first sensor electrodes 4 or the same threshold value cth may be set for the first sensor electrodes 4.

When any of the change amounts c is not equal to or larger than the threshold value cth (NO in step S103), that is, when all the change amounts ca to cd are smaller than the threshold value cth, the determination section 52 determines that the operation body has not approached any of the second sensor electrodes 6 (step S104).

On the other hand, when at least one of the change amounts c is equal to or larger than the threshold value cth (YES in step S103), the determination section 52 determines that the operation body has approached one of the second sensor electrodes 6 which corresponds to the first sensor electrode 4 having the change amount c equal to or larger than the threshold value cth (step S105). When there are a plurality of the change amounts c which are equal to or larger than the threshold value cth, the determination section 52 determines that the operation body has approached one of the second sensor electrodes 6 which corresponds to the first sensor electrode 4 in which a difference between a change amount c thereof and the threshold value cth is largest in the change amounts c which are equal to or larger than the threshold value cth, for example. Alternatively, the determination section 52 may determine that the operation body has approached a plurality of the second sensor electrodes 6 corresponding to a plurality of the first sensor electrodes 4 in which the change amounts c thereof are equal to or larger than the threshold value cth, for example.

After step S104 or step S105, the determination section 52 outputs a result of the determination (step S106). The determination result output from the determination section 52 indicates a result of the detection of the approach of the operation body by the detection circuit 5 and is input to a signal processing device or the like connected to a later stage of the detection circuit 5.

The input device 100 detects approach of the operation body to the second sensor electrodes 6 by executing the operation described above every predetermined period of time.

As described above, according to this embodiment, the sensing area of the input device 100 may be increased by increasing the size of the second sensor electrodes 6 without increasing the size of the first sensor electrodes 4. In other words, the first sensor electrodes 4 required for realizing a desired sensing area may be miniaturized. By this, the substrate 3 of the touch sensor 7 may be miniaturized and a degree of freedom of layout on the substrate 3 may be improved.

Furthermore, since the substrate 3 is disposed in a predetermined position of the lower case 11 through the support 2 and the second sensor electrodes 6 are disposed in predetermined positions on the upper case 12, the substrate 3 may be disposed such that the first sensor electrodes 4 and the corresponding second sensor electrodes 6 face each other with a certain distance therebetween only by assembling the lower case 11 and the upper case 12. By this, an assembling property of the input device 100 may be improved.

Figure 5:
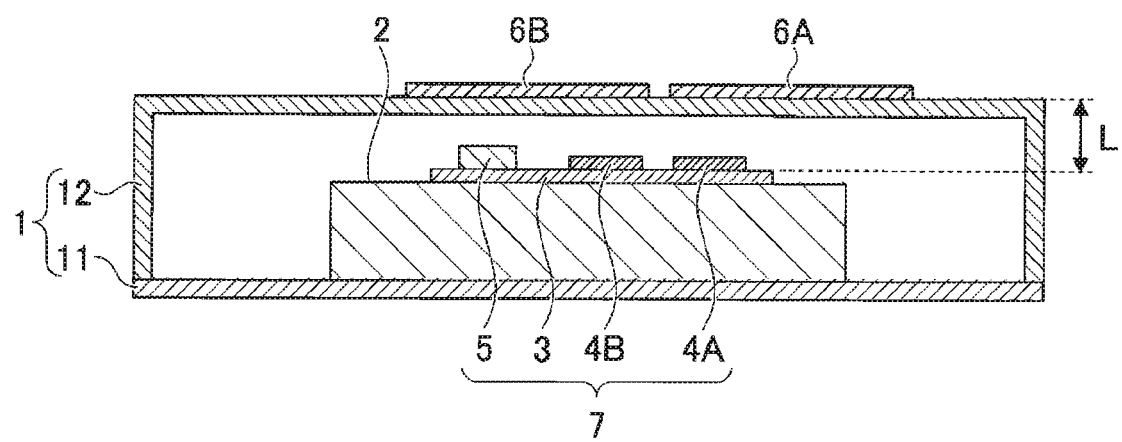
FIG. 5 is a cross-sectional view of a modification of the input device.

FIG. 5 is a cross-sectional view of a modification of the input device 100 according to this embodiment. In the example of FIG. 5, the second sensor electrodes 6 are disposed on an outer surface of the case 1 (the upper surface of the top plate). With this configuration, decorative plating (decoration formed by plating) formed on an outer surface of the input device 100 may be used as the second sensor electrodes 6. Furthermore, the operation body may touch the second sensor electrodes 6. When the operation body touches the second sensor electrodes 6, the second sensor electrodes 6 have a constant ground potential, and therefore, the detection circuit 5 may stably detect approach (touch) of the operation body. Note that, in a case where the decorative plating is connected to the ground similarly to in-vehicle products, an electrostatic capacitance of the decorative plating is not changed even when the operation body touches the decorative plating, and therefore, the decorative plating may not be used as the second sensor electrodes 6. In this case, the decorative plating may be used as the second sensor electrodes 6 by connecting a diode between the decorative plating and the ground.

Note that, although the method for determining approach of the operation body by comparing the change amounts c with the threshold value cth is illustrated in FIG. 4, the method for determining approach of the operation body by the determination section 52 is not limited to this. For example, the determination section 52 may determine approach of the operation body by comparing the electrostatic capacitances C with a threshold value for the electrostatic capacitances C or determine approach of the operation body based on temporal patterns of the electrostatic capacitances C and the change amounts c. The determination section 52 may employ an arbitrary determination method based on the electrostatic capacitances C.

Second Embodiment

Figure 6:
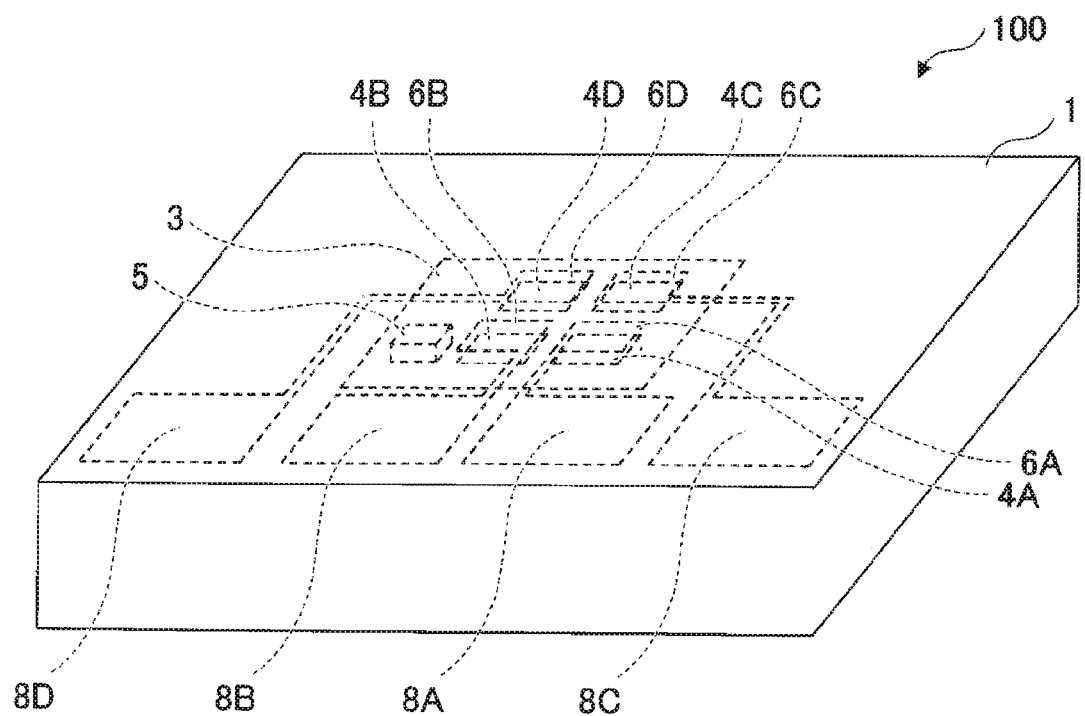
FIG. 6 is a perspective view of an example of an input device according to a second embodiment.

An input device 100 according to a second embodiment will be described with reference to FIG. 6. FIG. 6 is a perspective view of an example of the input device 100 according to this embodiment. In FIG. 6, a support 2 is omitted so that the other components are clearly viewed. As illustrated in FIG. 6, the input device 100 of this embodiment additionally includes third sensor electrodes 8A to 8D. Components and operations other than the third sensor electrodes 8A to 8D in the input device 100 of this embodiment are the same as those of the first embodiment. Hereinafter, the third sensor electrodes 8A to 8D are referred to as third sensor electrodes 8 when the third sensor electrodes 8A to 8D are not distinguished from one another.

The third sensor electrodes 8 are disposed for a sensing area for detecting approach of an operation body, is disposed on a surface of a case 1 which includes second sensor electrodes 6, and is formed of a metallic foil (such as a copper foil), a metallic plate, or plating. As with the second sensor electrodes 6, the third sensor electrodes 8 are not connected to first sensor electrodes 4. On the other hand, the third sensor electrodes 8 are electrically connected to the corresponding second sensor electrodes 6 through wiring formed of a metallic foil (such as a copper foil), a metallic plate, or plating. Note that, in the example of FIG. 6, the third sensor electrode 8A corresponds to a second sensor electrode 6A, the third sensor electrode 8B corresponds to a second sensor electrode 6B, the third sensor electrode 8C corresponds to a second sensor electrode 6C, and the third sensor electrode 8D corresponds to a second sensor electrode 6D. Furthermore, although the third sensor electrodes 8 have a rectangle shape in the example of FIG. 6 in a plan view, the present invention is not limited to this. Moreover, the input device 100 includes at least one third sensor electrode 8.

With this configuration, the third sensor electrodes 8 are electrically connected to the second sensor electrodes 6 capacitively coupled to the first sensor electrodes 4. Consequently, when the operation body approaches the third sensor electrodes 8, electrostatic capacitances C of the first sensor electrodes 4 corresponding to the third sensor electrodes 8 approached by the operation body is changed through the second sensor electrodes 6. Accordingly, a detection circuit 5 may detect approach of the operation body to the third sensor electrodes 8 based on the electrostatic capacitances C of the first sensor electrodes 4. When the operation body approaches the third sensor electrode 8A, for example, an electrostatic capacitance Ca of a first sensor electrode 4A corresponding to the third sensor electrode 8A is changed through the second sensor electrode 6A, and therefore, the detection circuit 5 may detect approach of the operation body to the third sensor electrode 8A based on an electrostatic capacitance Ca.

The third sensor electrodes 8 are preferably formed larger than the first sensor electrodes 4 as illustrated in FIG. 6. Accordingly, a size of the sensing area of the input device 100 may be increased without increasing the size of the first sensor electrodes 4.

Furthermore, the third sensor electrodes 8 are preferably formed larger than the second sensor electrodes 6 as illustrated in FIG. 6. Accordingly, a degree of freedom of layout of the third sensor electrodes 8 (sensing area) may be improved.

Furthermore, the second sensor electrodes 6 are preferably disposed close to one another as illustrated in FIG. 6. Accordingly, when the operation body approaches the second sensor electrodes 6, the individual electrostatic capacitances C are similarly changed, and therefore, approach of the operation body to the second sensor electrodes 6 and approach of the operation body to the third sensor electrodes 8 may be easily distinguished from each other. When determining that only one of change amounts c is equal to or larger than a threshold value cth, a determination section 52 may determine that the operation body has approached one of the third sensor electrodes 8 corresponding to one of the first sensor electrodes 4 which has the change amount c equal to or larger than the threshold value cth, whereas when determining that there are a plurality of the change amounts c which are equal to or larger than the threshold value cth, the determination section 52 may determine that the operation body has approached the second sensor electrodes 6, for example. Furthermore, when determining that only one or two of the change amounts c are equal to or larger than the threshold value cth, the determination section 52 may determine that the operation body has approached one of the third sensor electrodes 8 corresponding to one of the first sensor electrodes 4 in which a difference between the change amount c and the threshold value cth is largest, whereas when determining that three or more of the change amounts c are equal to or larger than the threshold value cth, the determination section 52 may determine that the operation body has approached the second sensor electrodes 6, for example. Consequently, false detection in which approach of the operation body to the second sensor electrodes 6 is detected as approach of the operation body to the third sensor electrodes 8 may be avoided.

As described above, according to this embodiment, the third sensor electrodes 8 may be disposed arbitrary positions connectable to the second sensor electrodes 6 through the wiring. Accordingly, a degree of freedom of layout of the sensing area of the input device 100 may be improved.

Note that the present invention is not limited to the configurations described above, and combinations of the configurations described in the foregoing embodiments and other elements may be included in the present invention. Modifications may be made without departing from the scope of the present invention and may be appropriately defined in accordance with applied embodiments.

What is claimed is:

1. An input device for inputting information in accordance with an approach of an operation body thereto, the input device comprising:
   at least one first sensor electrode disposed on a substrate;
   at least one second sensor electrode corresponding to an sensing area, the second sensor electrode being disposed so as to face the first sensor electrode via an empty space providing a distance therebetween in a direction normal to the sensing area, thereby capacitively coupled with the first sensor electrode, the first sensor electrode and the second sensor electrode overlapping each other in plan view which is viewed from the direction normal to the sensing area; and
   a detection circuit configured to detect the approach of the operation body to the second sensor electrode based on an electrostatic capacitance of the first sensor electrode.

2. The input device according to claim 1,
   wherein an area of the second sensor electrode is larger than an area of the first sensor electrode.

3. The input device according to claim 1, further comprising:
   a case accommodating the substrate,
   wherein the second sensor electrode is disposed on the case.

4. The input device according to claim 3,
   wherein the second sensor electrode is disposed on an inner surface of the case.

5. The input device according to claim 3,
   wherein the second sensor electrode is disposed on an outer surface of the case.

6. The input device according to claim 1,
   wherein the second sensor electrode is formed by plating.

7. The input device according to claim 1,
   wherein the detection circuit is configured to determine that the operation body has approached the second sensor electrode if an amount of change in the electrostatic capacitance of the first sensor electrode is equal to or greater than a threshold value.

8. The input device according to claim 1, further comprising:
   a third sensor electrode corresponding to a sensing area, the third sensor electrode electrically connected to the second sensor electrode, the third sensor electrode not being connected to the first sensor electrode.

9. The input device according to claim 8,
   wherein an area of the third sensor electrode is larger than the area of the first sensor electrode.

10. The input device according to claim 8,
    wherein an area of the third sensor electrode is larger than the area of the second sensor electrode.

11. The input device according to claim 7,
    wherein a plurality of second sensor electrodes are disposed adjacent to one another, and a corresponding plurality of first sensor electrodes are provided on the substrate.

12. The input device according to claim 8,
    wherein, when an amount of change in the electrostatic capacitance of the first sensor electrode is equal to or greater than a threshold value, the detection circuit determines that the operation body has approached the third sensor electrode electrically connected to the second sensor electrode facing the first sensor electrode.

13. The input device according to claim 1, wherein the second sensor electrode is neither connected to the first sensor electrode nor connected to a ground.

14. The input device according to claim 1, wherein the second sensor electrode is not connected to the first sensor electrode, and is connected to a ground via a diode.

15. The input device according to claim 11, further comprising:
   a plurality of third sensor electrodes each corresponding to a sensing area, each of the plurality of third sensor electrodes being electrically connected to corresponding one of the second sensor electrodes, the third sensor electrodes not being connected to the first sensor electrodes,
   wherein the detection circuit is further configured to determine that the operation body has approached one of the third sensor electrodes if an amount of change in the electrostatic capacitance of the first sensor electrode facing the second sensor electrode which is connected to the third sensor electrode is equal to or greater than a threshold value while an amount of change in the electrostatic capacitance of the remaining first sensor electrodes is smaller than the threshold value, and to determine that the operation body has approached one of the second sensor electrodes if an amount of change in the electrostatic capacitance of two or more of the first sensor electrodes exceeds the threshold value.

* * * * *